US007602227B2

(12) United States Patent
Kim et al.

(10) Patent No.: US 7,602,227 B2
(45) Date of Patent: Oct. 13, 2009

(54) DIFFERENTIAL AMPLIFIER CIRCUIT AND MIXER CIRCUIT HAVING IMPROVED LINEARITY

(75) Inventors: Tae Wook Kim, Seoul (KR); Bonkee Kim, Gyeonggi-Do (KR); Kwyro Lee, Daejon (KR)

(73) Assignee: Integrant Technologies Inc., Gyeonggi-Do (KR)

( * ) Notice: Subject to any disclaimer, the term of this patent is extended or adjusted under 35 U.S.C. 154(b) by 195 days.

(21) Appl. No.: 11/128,351

(22) Filed: May 13, 2005

(65) Prior Publication Data
US 2006/0022740 A1   Feb. 2, 2006

(30) Foreign Application Priority Data
Jul. 31, 2004   (KR) .................. 10-2004-0060733

(51) Int. Cl.
*G06G 7/12*   (2006.01)
(52) U.S. Cl. ...................... 327/359; 327/355
(58) Field of Classification Search ......... 327/355–359; 455/333
See application file for complete search history.

(56) References Cited
U.S. PATENT DOCUMENTS

| | | | |
|---|---|---|---|
| 4,704,738 A | 11/1987 | Graziadei et al. | |
| 5,311,086 A * | 5/1994 | Yamaji et al. | 327/356 |
| 5,488,330 A | 1/1996 | Masuoka et al. | |
| 5,933,771 A | 8/1999 | Tiller et al. | |
| 6,114,907 A | 9/2000 | Sakurai | |
| 6,239,645 B1 * | 5/2001 | Tsukahara et al. | 327/359 |
| 6,693,485 B1 | 2/2004 | Huber | |
| 6,693,493 B2 | 2/2004 | Kim et al. | |
| 6,768,379 B2 * | 7/2004 | Umeda et al. | 330/261 |
| 6,871,057 B2 * | 3/2005 | Ugajin et al. | 455/323 |
| 6,888,411 B2 * | 5/2005 | Behzad et al. | 330/311 |

(Continued)

FOREIGN PATENT DOCUMENTS
EP   0 521 215 A1   1/1993

(Continued)

OTHER PUBLICATIONS

Manstretta et al., "Second-Order Intermodulation Mechanisms in CMOS Downconverters," *IEEE Journal of Solid-State Circuits*, vol. 38, No. 3, Mar. 2003, pp. 394-406.

(Continued)

*Primary Examiner*—Dinh T. Le
(74) *Attorney, Agent, or Firm*—Foley & Lardner LLP

(57) ABSTRACT

The present invention relates to a differential amplifier and a mixer for improving the linearity. The differential amplifier circuit according to this present invention, includes first and second load stages each having a predetermined voltage value, a main differential amplifier unit having a first differential stage that forms a differential pair in such a way as to amplify a difference between a first input voltage and a second input voltage, and a constant current source, which has a predetermined current driving capability and is connected serially between a power source voltage terminal and a ground terminal, and a auxiliary differential amplifier unit having a second differential stage that forms a differential pair in such a way as to amplify a difference between a third input voltage and a fourth input voltage connected between the first load stage and a second load stage, and the ground, respectively.

2 Claims, 11 Drawing Sheets

U.S. PATENT DOCUMENTS

| | | |
|---|---|---|
| 6,946,895 B2 | 9/2005 | Umeda et al. |
| 7,016,664 B2 * | 3/2006 | Souetinov .................. 455/323 |
| 7,193,467 B2 * | 3/2007 | Garlepp et al. .............. 330/259 |

FOREIGN PATENT DOCUMENTS

| | | |
|---|---|---|
| FR | 2 552 956 | 4/1985 |
| GB | 2 016 235 | 9/1979 |
| JP | 54-124957 | 9/1979 |
| JP | 04-245707 | 9/1992 |
| JP | 05-046792 | 2/1993 |
| JP | 07-094952 | 4/1995 |
| JP | 2000-013151 | 1/2000 |
| JP | 2000-183671 | 6/2000 |
| JP | 2001-257538 | 9/2001 |
| JP | 2002-111412 | 4/2002 |
| KR | 1020020025701 A | 4/2002 |

OTHER PUBLICATIONS

Variable Gain Amplifier for Use in Communication Application Specific Integrated Circuits; IBM Technical Disclosure Bulletin; IBM Corp.; vol. 1 38, No. 03, Mar. 1, 1995; pp. 241-243.

* cited by examiner

DIFFERENTIAL AMPLIFIER CIRCUIT AND MIXER CIRCUIT HAVING IMPROVED LINEARITY

BACKGROUND OF THE INVENTION

1. Field of the Invention

The present invention relates to a differential amplifier circuit, and more particularly, to a differential amplifier circuit having improved linearity, and a mixer circuit including the differential amplifier circuit.

2. Background of the Related Art

A RF circuit consisting of a single-ended circuit is weak in problems, such as signal coupling or even order distortion, in a higher integrated circuit such as SOC (System on a Chip). In order to solve these problems, a differential circuit is employed. That is, the differential circuit is effective in solving the aforementioned problems since it has high CMRR (Common Mode Rejection Ratio) and IIP2 (Input 2nd Intercept Point).

Further, in the RF circuit, the linearity is a very important factor. This has a close relation with a secondary differential coefficient (gm") of the transconductance of the amplifier circuit.

The applicant of this application filed a patent application, Korean Patent Application No. 10-2001-0003277, entitled "Single-Ended Differential Circuit Using Complementary Element" filed on 2001 in order to improve the linearity, and was issued with U.S. Pat. No. 6,693,493. Korean Patent Application No. 10-2001-0003277 and U.S. Pat. No. 6,693,493 relate to a method of offsetting the secondary differential coefficient (gm") of the transconductance using a secondary transistor.

Korean Patent Application No. 10-2001-0003277 and U.S. Pat. No. 6,693,493 disclose a circuit of a single-ended type. "Second-Order Inter-modulation Mechanisms in CMOS Downconverters, IEEE, J. of Solid State Circuits, vol. 38, No. 3 March 2003, pp 394-406", discloses that there are problems in that high CMRR and IIP2, which are the advantages of the above-described differential circuit, cannot be obtained if the method disclosed in Korean Patent Application No. 10-2001-0003277 and U.S. Pat. No. 6,693,493 are simply applied to a differential circuit.

SUMMARY OF THE INVENTION

Accordingly, the present invention has been made in view of the above problems occurring in the prior art, and it is an object of the present invention to provide a differential amplifier circuit, wherein IIP3 can be improved while making high CMRR or IIP2 being advantages of a differential circuit.

Another object of the present invention is to provide a differential amplifier circuit, wherein a mixer circuit capable of improving the linearity while making use of advantages of a differential circuit can be implemented.

To achieve the above object, according to an aspect of the present invention, there is provided a differential amplifier circuit, including first and second load stages each having a predetermined voltage value, a main differential amplifier unit having a first differential stage that forms a differential pair in such a way as to amplify a difference between a first input voltage and a second input voltage, and a constant current source, which has a predetermined current driving capability and is connected serially between a power source voltage terminal and a ground terminal, and a auxiliary differential amplifier unit having a second differential stage that forms a differential pair in such a way as to amplify a difference between a third input voltage and a fourth input voltage connected between the first load stage and a second load stage, and the ground, respectively.

According to the present invention, a negative value of gm" of the main differential amplifier unit is offset by a positive value of gm" of the auxiliary differential amplifier unit, thus minimizing the value gm". It is thus possible to implement a differential amplifier circuit having the linearity improved. Further, a differential operation can be performed with no problems while making use of the aforementioned advantages by using the differential amplifier circuit in which the main differential amplifier unit and the auxiliary differential amplifier unit are combined. Moreover, a differential amplifier circuit in which only a auxiliary differential amplifier unit is cascoded, a differential amplifier circuit in which only a main differential amplifier unit is cascoded, and a differential amplifier circuit in which the auxiliary differential amplifier unit and the main differential amplifier unit are cascoded can be implemented.

Furthermore, according to an aspect of the present invention, there is provided a mixer circuit having a differential amplifier circuit, the differential amplifier circuit including first and second load stages each having a predetermined load capability, a differential amplifier unit including a main differential amplifier unit, which has a first differential stage that forms a differential pair in such a way as to amplify a difference between a first input voltage and a second input voltage, and a constant current source having a predetermined current driving capability and connected between a power source voltage terminal and a ground terminal in a serial manner, and a auxiliary differential amplifier unit including a second differential stage that forms a differential pair in such a way as to amplify a difference between a third input voltage and a fourth input voltage connected between the first load stage and a second load stage, and the ground, respectively, and a mixer unit including a first mixer unit consisting of first and second transistors respectively having first, second and third terminals, and a second mixer unit consisting of third and fourth transistors respectively having first, second and third terminals, wherein the first mixer unit and second mixer unit are connected between the first load stage and the second load stage, and the differential amplifier unit.

According to the present invention, it is possible to implement a mixer circuit in which the linearity of an amplifier stage is improved by implementing a differential amplifier circuit in a mixer circuit.

Furthermore, according to an aspect of the present invention, there is provided a double balance mixer circuit, including first and second load stages respectively having a load resistor, a mixer stage including a first mixer unit comprised of first and second transistors having first, second and third terminals, and a second mixer unit comprised of third and fourth transistors having first, second and third terminals, wherein a first terminal of each of the first and third transistors and a first terminal of each of the second and fourth transistors are coupled and then connected to first and second load stages, a local oscillation signal is input to a second terminal of each of the first to fourth transistors, and a third terminal of each of the first and second transistors and a third terminal of each of the third and fourth transistors are coupled and then connected to an amplifier stage, and the amplifier stage in which fifth and sixth transistors and seventh and eighth transistors form differential pairs, respectively, wherein the amplifier stage includes a main differential amplifier unit in which the fifth and sixth transistors form a differential pair, each of the fifth and sixth transistors has first, second and third terminals, the respective first terminals are connected to a switching stage, the respective second terminals are connected to an input stage, the respective third terminals are coupled and then connected serially to a constant current source having a predetermined current driving capability, and a auxiliary differential amplifier unit in which seventh and eighth transistor form a differential pair, each of the seventh and eighth transistors has first, second and third terminals, the respective first terminals are connected to the switching stage, the respective second terminals are connected to the input stage, and the respective third terminals are grounded.

According to the present invention, it is possible to implement a double balance mixer circuit in which the linearity of an amplifier stage is improved by implementing a differential amplifier circuit in a mixer circuit.

Furthermore, according to an aspect of the present invention, there is provided a folded cascode mixer circuit, including first and second bias current sources for supplying a bias current to a mixer stage, the mixer stage including a first mixer unit consisting of first and second transistors each having first, second and third terminals, and a second mixer unit consisting of third and fourth transistors having first, second and third terminals, wherein the third terminal of each of the first to fourth transistors is connected to an amplifier stage, each of the second terminals is applied with a local oscillation signal, and the first terminal of each of the first and third transistors and the first terminal of each of the second and fourth transistors are coupled and then connected to an output stage, and the amplifier stage in which fifth and sixth transistors and seventh and eighth transistors form differential pairs, respectively, wherein the amplifier stage includes a main differential amplifier unit in which the fifth and sixth transistors form a differential pair, each of the fifth and sixth transistors has first, second and third terminals, the respective first terminals are connected to the mixer stage, the respective second terminals are connected to an input stage, the respective third terminals are coupled and then connected serially to a constant current source having a predetermined current driving capability, and a auxiliary differential amplifier unit in which seventh and eighth transistor form a differential pair, each of the seventh and eighth transistors has first, second and third terminals, the respective first terminals are connected to the mixer stage, the respective second terminals are connected to the input stage, and the respective third terminals are grounded.

According to the present invention, it is possible to implement a folded cascode mixer circuit in which the linearity of an amplifier stage is improved by implementing a differential amplifier circuit in a mixer circuit. The first to fourth transistors are preferably implemented using PMOS.

Furthermore, according to an aspect of the present invention, there is provided a LC-folded cascode mixer circuit, including first and second load stages in which a passive element inductor and a capacitor are connected in a parallel manner, a mixer stage including a first mixer unit consisting of first and second transistors each having first, second and third terminals, and a second mixer unit consisting of third and fourth transistors having first, second and third terminals, wherein the third terminal of each of the first to fourth transistors is connected to an amplifier stage, each of the second terminals is applied with a local oscillation signal, and the first terminal of each of the first and third transistors and the first terminal of each of the second and fourth transistors are coupled and then connected to an output stage, and the amplifier stage in which fifth and sixth transistors and seventh and eighth transistors form differential pairs, respectively, wherein the amplifier stage includes a main differential amplifier unit in which the fifth and sixth transistors form a differential pair, each of the fifth and sixth transistors has first, second and third terminals, the respective first terminals are connected to the mixer stage, the respective second terminals are connected to an input stage, the respective third terminals are coupled and then connected serially to a constant current source having a predetermined current driving capability, and a auxiliary differential amplifier unit in which seventh and eighth transistor form a differential pair, each of the seventh and eighth transistors has first, second and third terminals, the respective first terminals are connected to the mixer stage, the respective second terminals are connected to the input stage, and the respective third terminals are grounded.

According to the present invention, it is possible to implement a LC-folded cascode mixer circuit in which the linearity of an amplifier stage is improved by implementing a differential amplifier circuit in a mixer circuit. The first to fourth transistors are preferably implemented using PMOS.

Furthermore, according to an aspect of the present invention, there is provided a folded cascode mixer circuit, including first and second bias current sources for supplying a bias current to a mixer stage, a mixer stage including a first mixer unit consisting of first and second transistors each having first, second and third terminals, a second mixer unit consisting of third and fourth transistors having first, second and third terminals, and a constant current source for applying a bias to the first mixer unit and the second mixer unit, wherein the first terminal of each of the first and third transistors and the first terminal of each of the second and fourth transistors are coupled and then connected to an output stage, the second terminal of each of the first to fourth transistors is applied with a local oscillation signal, the respective third terminals of the first and second transistors are coupled and then connected to an amplifier stage, and the respective third terminals of the third and fourth transistors are coupled and then connected to the amplifier stage, and the amplifier stage in which fifth and sixth transistors and seventh and eighth transistors form differential pairs, respectively, wherein the amplifier stage includes a main differential amplifier unit in which the fifth and sixth transistors form a differential pair, each of the fifth and sixth transistors has first, second and third terminals, the respective first terminals are connected to the mixer stage, the respective second terminals are connected to an input stage, the respective third terminals are coupled and then connected serially to a constant current source having a predetermined current driving capability, and a auxiliary differential amplifier unit in which seventh and eighth transistor form a differential pair, each of the seventh and eighth transistors has first, second and third terminals, the respective first terminals are connected to the mixer stage, the respective second terminals are connected to the input stage, and the respective third terminals are grounded.

Furthermore, according to an aspect of the present invention, there is provided a LC-folded cascode mixer circuit, including first and second load stages in which a passive element inductor and a capacitor are connected in a parallel manner, a mixer stage including a first mixer unit consisting of first and second transistors each having first, second and third terminals, a second mixer unit consisting of third and fourth transistors having first, second and third terminals, and a constant current source for applying a bias to the first mixer unit and the second mixer unit, wherein the first terminal of each of the first and third transistors and the first terminal of each of the second and fourth transistors are coupled and then connected to an output stage, the second terminal of each of the first to fourth transistors is applied with a local oscillation signal, the respective third terminals of the first and second transistors are coupled and then connected to an amplifier stage, and the respective third terminals of the third and fourth transistors are coupled and then connected to the amplifier stage, and the amplifier stage in which fifth and sixth transistors and seventh and eighth transistors form differential pairs, respectively, wherein the amplifier stage includes a main differential amplifier unit in which the fifth and sixth transistors form a differential pair, each of the fifth and sixth transistors has first, second and third terminals, the respective first terminals are connected to the mixer stage, the respective second terminals are connected to an input stage, the respective third terminals are coupled and then connected serially to a constant current source having a predetermined current driving capability, and a auxiliary differential amplifier unit in which seventh and eighth transistor form a differential pair, each of the seventh and eighth transistors has first, second and third terminals, the respective first terminals are connected to the mixer stage, the respective second terminals are connected to the input stage, and the respective third terminals are grounded.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

The present invention will now be described in detail in connection with preferred embodiments with reference to the accompanying drawings.

Further, MOSFET will be described as an example in the following description. It is, however, to be noted that the present invention can be applied to a bipolar junction transistor that can be used as an amplifier as well as MOSFET. Therefore, although MOSFET will be described as an example in this context, the present invention is not limited to MOSFET.

Figure 1:
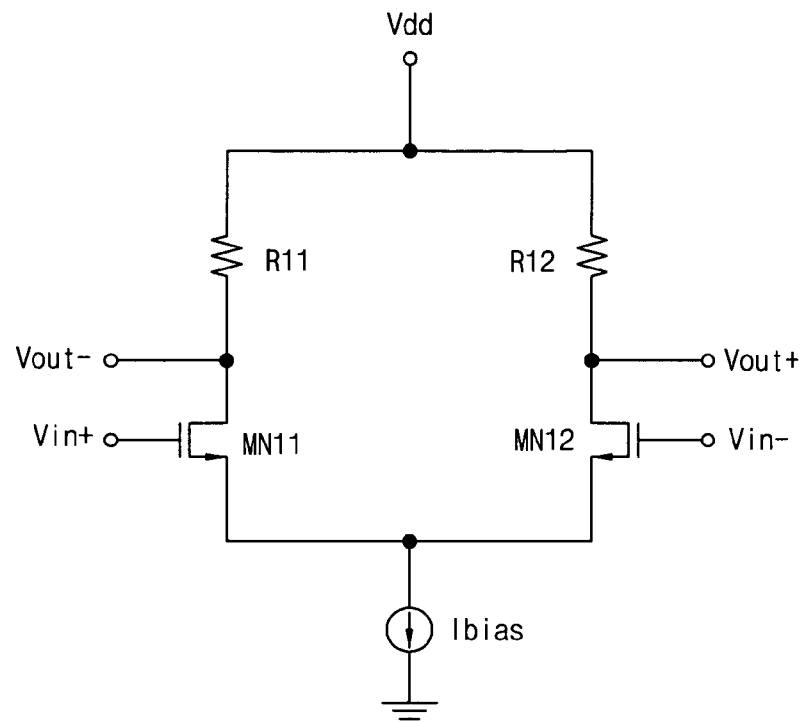
FIG. 1 is a circuit diagram of a fully differential amplifier (FDA) of a current-biased differential amplifier circuit among a differential amplifier circuit which is to be proposed by the present invention.

FIG. 1 is a circuit diagram of a fully differential amplifier (FDA) of a current-biased differential amplifier circuit among a differential amplifier circuit, which is to be proposed by the present invention.

Referring to FIG. 1, the FDA includes first and second load resistors R11, R12, first and second NMOS transistors MN11, MN12, and a bias current source Ibias. Generally, in a differential amplifier, the first and second load resistors R11, R12 are set to have the same resistance value, and the first and second NMOS transistors MN11, MN12 are set to have the same characteristic. The first and second NMOS transistors MN11, MN12 have respective gates to which first and second input voltages Vin+, Vin− are applied, respectively. The FDA amplifies a difference between the input voltages.

Figure 2:
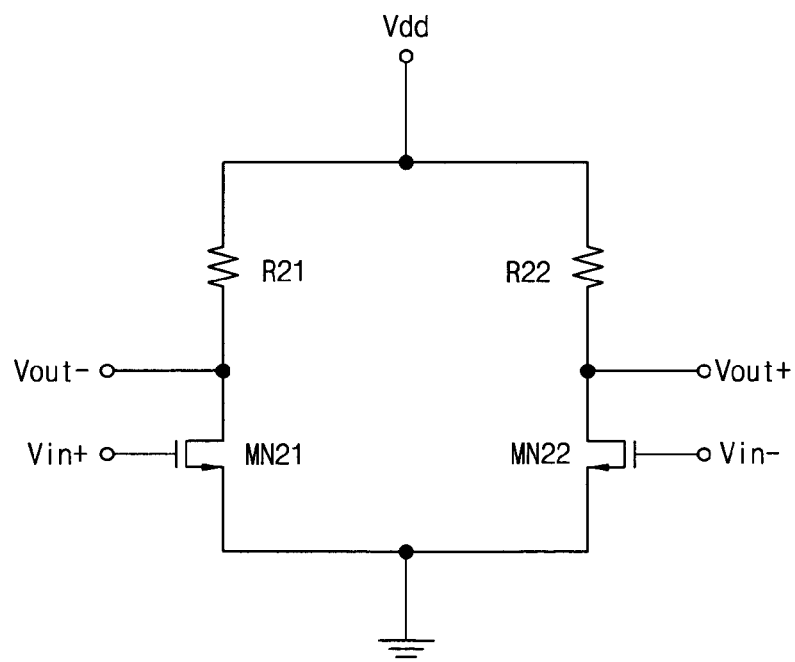
FIG. 2 is a circuit diagram of a pseudo differential amplifier (PDA) of a differential amplifier circuit having no current bias among a differential amplifier circuit which is to be proposed by the present invention.

FIG. 2 is a circuit diagram of a pseudo differential amplifier (PDA) of a differential amplifier circuit having no current bias among a differential amplifier circuit, which is to be proposed by the present invention.

Referring to FIG. 2, the PDA includes first and second load resistors R21, R22, and first and second NMOS transistors MN21, MN22. In the same manner as the FDA of the differential amplifier circuit shown in FIG. 1, the first and second load resistors R11, R12 are set to have the same resistance value, and the first and second NMOS transistors MN21, MN22 are set to have the same characteristic. The first and second NMOS transistors MN21, MN22 have respective gates to which first and second input voltages Vin+, Vin− are applied, respectively. The FDA amplifies a difference between the input voltages.

Figure 3:
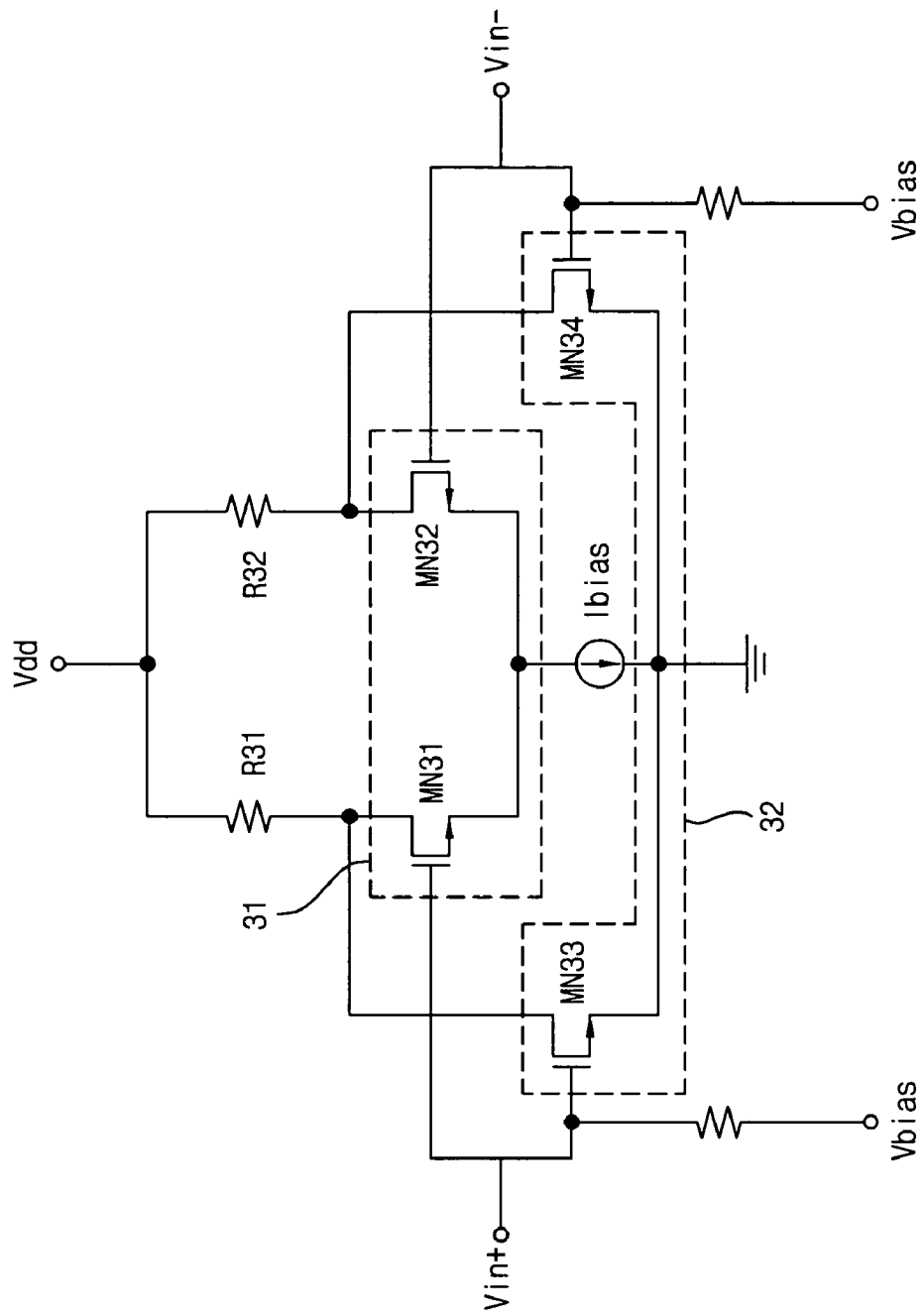
FIG. 3 shows a circuit having a basic construction for explaining the differential amplifier circuit according to the present invention.

FIG. 3 shows a circuit having a basic construction for explaining the differential amplifier circuit according to the present invention.

Referring to FIG. 3, the differential amplifier circuit according to the present invention has a structure in which the fully differential amplifier (FDA) of the current-biased differential amplifier circuit shown in FIG. 1, which is used as a main differential amplifier unit, and the pseudo differential amplifier (PDA) of the differential amplifier circuit having no current bias shown in FIG. 2, which is used as a auxiliary differential amplifier unit, are connected in a parallel manner.

The differential amplifier circuit includes a main differential amplifier unit 31 having first and second load resistors R31, R32, first and second NMOS transistors MN31, MN32, and a bias current source Ibias, and a auxiliary differential amplifier unit 32 having third and fourth NMOS transistors MN33, MN34.

In the main differential amplifier unit 31, the first load resistor R31 and the first transistor MN31 are serially connected, and the second load resistor R32 and the second transistor MN32 are serially connected. The first and second transistors MN31, MN32 are connected to an internal supply voltage Vdd through the first and second load resistors R31, R32, respectively. The current source Ibias that operates as differential mode is connected between the source of the first and second transistors MN31, MN32, and a reference voltage GND.

Further, the first transistor MN31 has a gate to which a first input voltage Vin+ is input, and the second transistor MN32 has a gate to which a second input voltage Vin− is input. Thus, the main differential amplifier unit 31 outputs a voltage corresponding to a difference between the inputs.

The auxiliary differential amplifier unit 32 includes the third and fourth transistors MN33, MN34. The third transistor MN33 has a drain connected to a drain of the first transistor MN31, and a source connected to the reference voltage GND. The fourth transistor MN34 has a drain connected to a drain of the second transistor MN32, and a source connected to the reference voltage GND. The third and fourth transistors MN33, MN34 have gates to which the first and second input voltages Vin+, Vin− are respectively input, and a bias voltage Vbias is also applied.

The operational characteristics of the circuit according to an embodiment of the present invention will now be described with reference to FIGS. 3 to 6.

Characteristics related to IIP2 and CMRR being the advantages of the differential circuit in the fully differential amplifier (FDA) having a current source, which is used as the main differential amplifier unit, and the pseudo differential amplifier (PDA) not having the current source, which is used as the auxiliary differential amplifier unit, will be first described. The main differential amplifier unit 31 is applied with infinite feedback by the bias current source Ibias in a common mode signal. The bias current source Ibias serves as a virtual ground at a differential mode signal. Thus, CMRR (Common Mode Rejection Ratio) and IIP2 (Input 2nd Intercept Point) are high. On the other hand, since the auxiliary differential amplifier unit does not have the bias current source Ibias, CMRR is low and IIP2 is also low unlike the main differential amplifier unit.

Figure 4A:
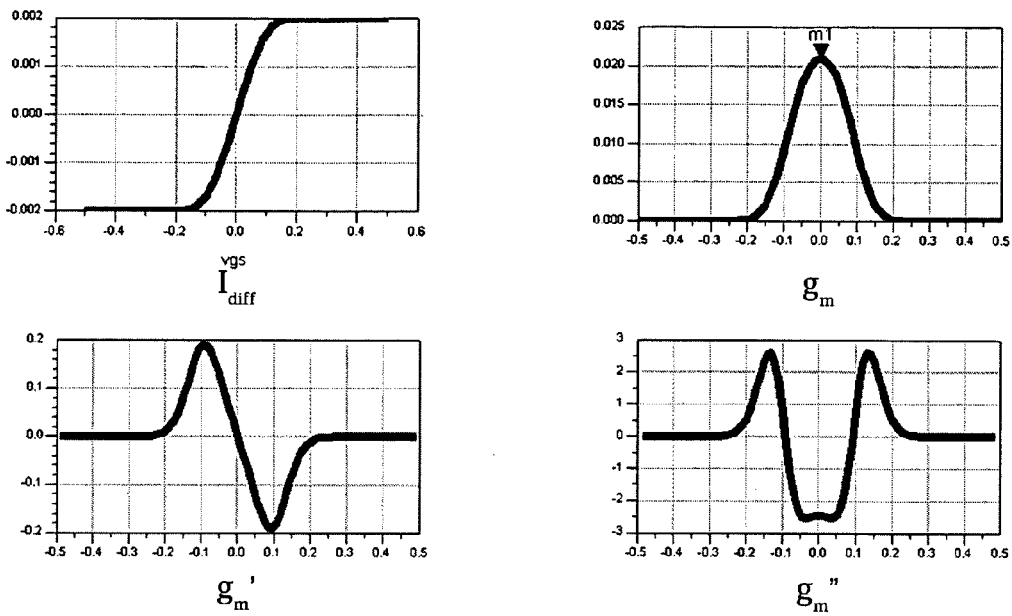
FIG. 4a is a graph showing the relation between the current and first, second and third differential values gm, gm' and gm" of gate voltages for a drain current when only the fully differential amplifier (FDA) of the current-biased differential amplifier circuit shown in FIG. 1 is driven.

When an amplifier circuit of the main differential amplifier unit 31 is driven, current I, and first, second and third differential values gm, gm' and gm" of gate voltages for the drain current are shown in FIG. 4a.

More particularly, the amount of the third differential value gm" of the gate voltage for the drain current is a value, which is closely related to a third distortion signal (IMD3, $3^{rd}$ order inter-modulation distortion). The lower the amount of gm", the better the linearity (IIP3).

Figure 4B:
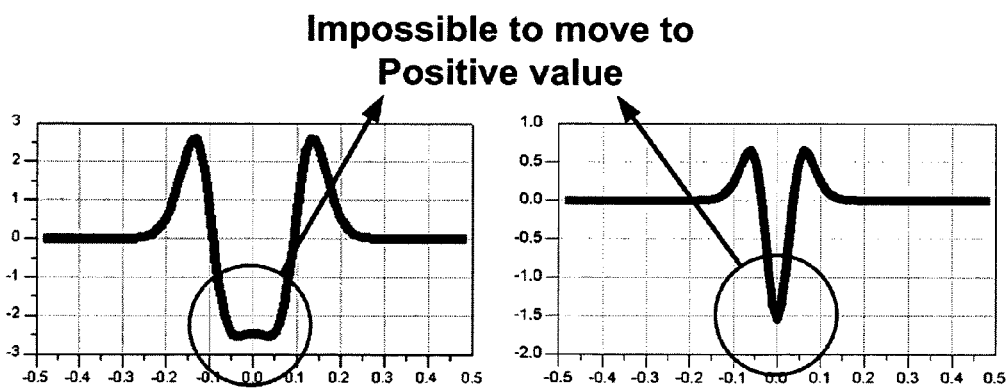
FIG. 4b is a graph showing variation in the value gm" depending upon variation in the bias of main and auxiliary differential amplifier units according to an embodiment of the present invention.

As shown in FIG. 4b, however, the value of gm" that dominates the characteristics of IP3 in a bias region to be used has a negative value.

In the structure of the main differential amplifier unit 31, the negative value of gm" cannot be converted into a positive value by way of a method of changing the current source Ibias. Changing the current source Ibias leads to conversion only in the amount of gm". Accordingly, in order to convert the negative value of gm" into the positive value, the auxiliary differential amplifier unit 32 has to be used.

Figure 4C:
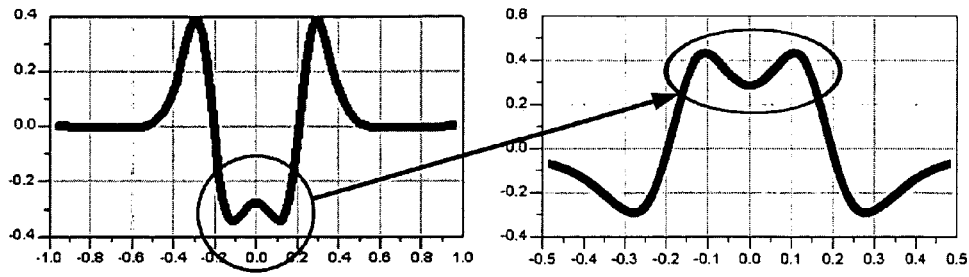
FIG. 4c is a graph showing variation in the value gm" depending upon variation in the bias of the auxiliary differential amplifier unit according to an embodiment of the present invention.

FIG. 4c is a graph showing variation in the value gm" depending upon change in the bias of the auxiliary differential amplifier unit according to an embodiment of the present invention.

From FIG. 4c, it can be seen that the negative value of gm" can be converted into the negative value by changing the bias voltage applied to the auxiliary differential amplifier unit.

Referring back to FIG. 3, the differential amplifier circuit according to an embodiment of the present invention has a structure in which the main differential amplifier unit 31 and the auxiliary differential amplifier unit 32 are connected in a parallel way. Therefore, the negative value of gm" of the main differential amplifier unit 31 is made to have a value that can be ignored by offsetting it by the positive value of gm" of the secondary amplifier 32. Furthermore, since the current rarely flows through the third and fourth transistors MN33, MN34 of the auxiliary differential amplifier unit 32, gain does not exist. Accordingly, since CMRR performs an operation under the control of the main differential amplifier unit 31, CMRR is high, and IIP2 is also high accordingly. It is thus possible to improve the linearity while making use of the advantages of the differential amplifier circuit.

Figure 5:
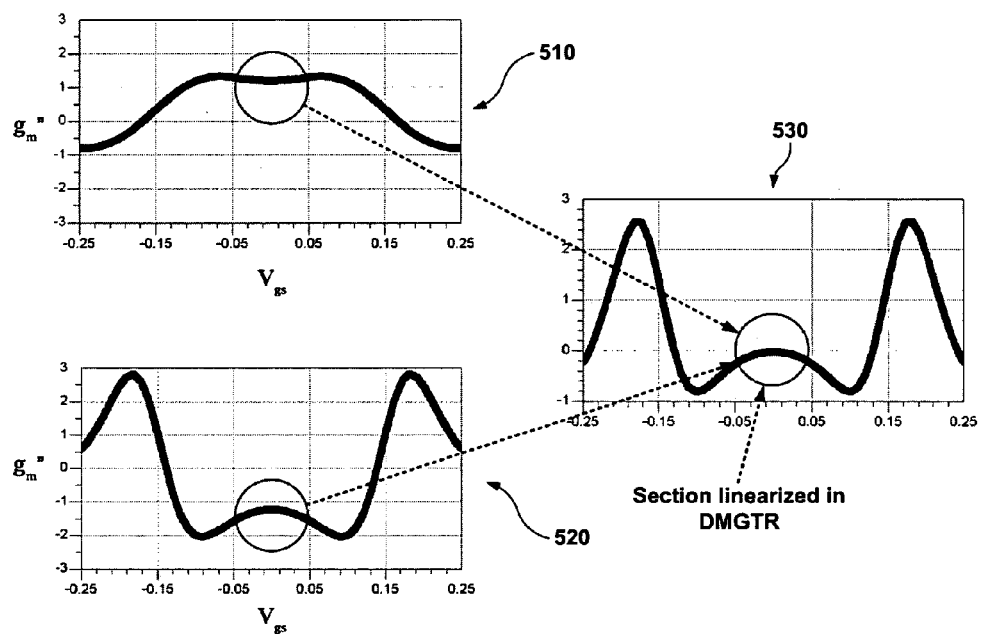
FIG. 5 is a graph showing improved linearity depending upon the coupling of a secondary amplifier and a main amplifier.

FIG. 5 is a graph showing the improvements of the linearity through offset of the secondary differential coefficient gm" of the transconductance depending upon the coupling of the secondary amplifier and the main amplifier.

From FIG. 5, it can be seen that the result of summing the gm" characteristic in a secondary amplifier 510 and the gm" characteristic in a main amplifier 520 are offset in a differential amplifier 530 according to the present invention, and thus have a linear section.

Figure 6:
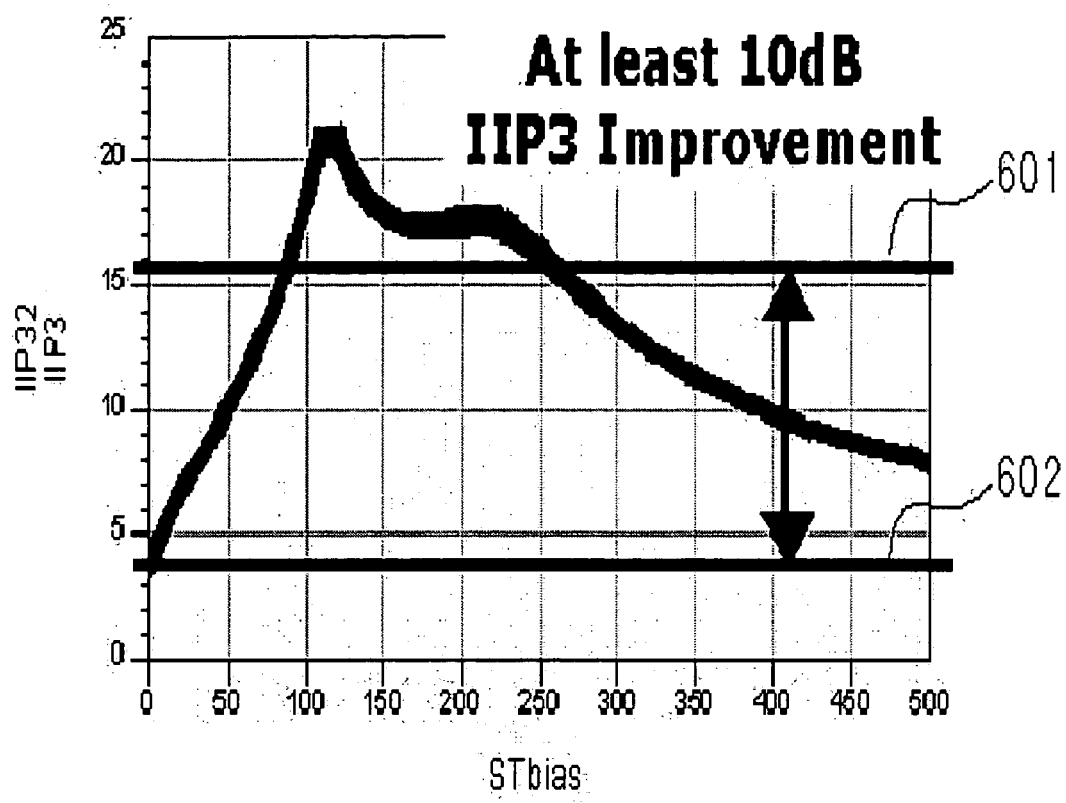
FIG. 6 shows a simulation result of IIP3 through control of the bias voltage applied to transistors of the auxiliary differential amplifier unit by means of the differential amplifier circuit according to the present invention.

FIG. 6 shows a simulation result of IIP3 through control of the bias applied to the transistors MN33, MN34 of the auxiliary differential amplifier unit by means of the differential amplifier circuit according to the present invention.

As shown in FIG. 6, if the bias voltage is not applied, the value of IIP3 becomes −1.315 dBm. If the bias voltage is 60, the value of IIP3 becomes 9.917 dBm. If the bias voltage is 145, the value of IIP3 becomes 11.720 dBm. Thus, there is an improvement effect of about 10 dB in overall.

Figure 7:
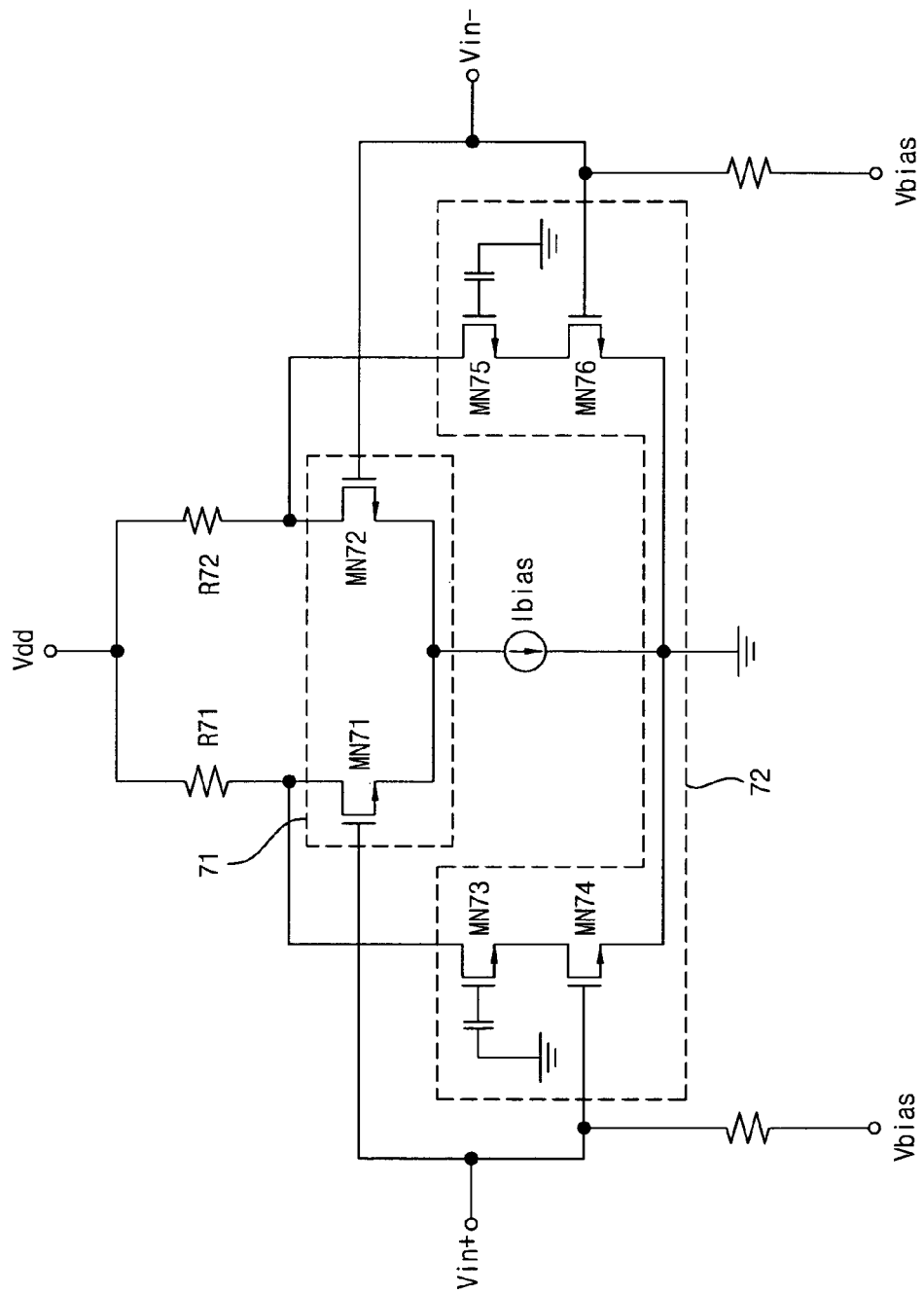
FIG. 7 is a circuit diagram of a differential amplifier circuit having a cascode auxiliary differential amplifier unit according to an embodiment of the present invention.

FIG. 7 is a circuit diagram of a differential amplifier circuit having a cascode auxiliary differential amplifier unit according to an embodiment of the present invention.

Referring to FIG. 7, the differential amplifier circuit according to the present invention has a structure in which a current-biased main differential amplifier unit and a secondary cascode differential amplifier not having a current bias are connected in a parallel manner.

A main differential amplifier unit 71 includes first and second load resistors R71, R72, first and second NMOS transistors MN71, MN72, and a bias current source Ibias.

A secondary cascode differential amplifier 72 includes a first circuit unit having cascoded third and fourth transistors MN73, MN74, and a second circuit unit having cascoded fifth and sixth transistors MN75, MN76.

The first and second circuit units 73 and 74 form a differential pair. Gates of the third and fifth transistors MN73, MN75 are connected to a reference voltage GND. To gates of the fourth and sixth transistors MN74, MN76 are applied with a bias voltage Vbiasdl.

The main differential amplifier unit 71 has the first load resistor R71 and the first transistor MN71 serially connected to each other, and the second load resistor R72 and the second transistor MN72 serially connected to each other. The first and second transistors MN71, MN72 are connected to an internal supply voltage Vdd through the first and second load resistors R71, R72, respectively. A current source Ibias that serves in differential mode is connected between sources of the first and second transistors MN71, MN72, and the reference voltage GND.

Further, the first transistor MN71 has a gate to which a first input voltage Vin+ is applied, and the second transistor MN72 has a gate to which a second input voltage Vin− is applied. The differential amplifier amplifies a difference between the input voltages.

In a cascode amplifier of the secondary cascode differential amplifier 72, (Miller capacitance between the gate and drain of the transistor reduces. Accordingly, the frequency characteristic of the amplifier is improved, and an output resistance taken on the part of the drain of the transistor is increased. As a result, the gain that can be obtained by connecting the load to the drain increases.

Furthermore, as the main differential amplifier unit 71 and the secondary cascode differential amplifier 72 are connected in parallel manner, the negative value of gm" of the main differential amplifier unit 71 gm" can be made to have a value that can be ignored by offsetting it by the positive value gm" of the secondary cascode amplifier unit 72. Further, since the current rarely flows through the third to sixth transistors MN73 to MN76 of the secondary cascode differential amplifier 72, a gain does not exist. Accordingly, since CMRR performs an operation under the control of the main differential amplifier unit 71, CMRR is high, and IIP2 is also high accordingly. It is thus possible to improve the linearity while making use of the advantages of the differential amplifier circuit.

In the same manner as the differential amplifier circuit having the cascode auxiliary differential amplifier unit shown in FIG. 7, the differential amplifier circuit can be contrasted by cascading the main differential amplifier unit. It is also possible to construct the differential amplifier circuit by cascading the auxiliary differential amplifier unit and the main differential amplifier unit.

Figure 8:
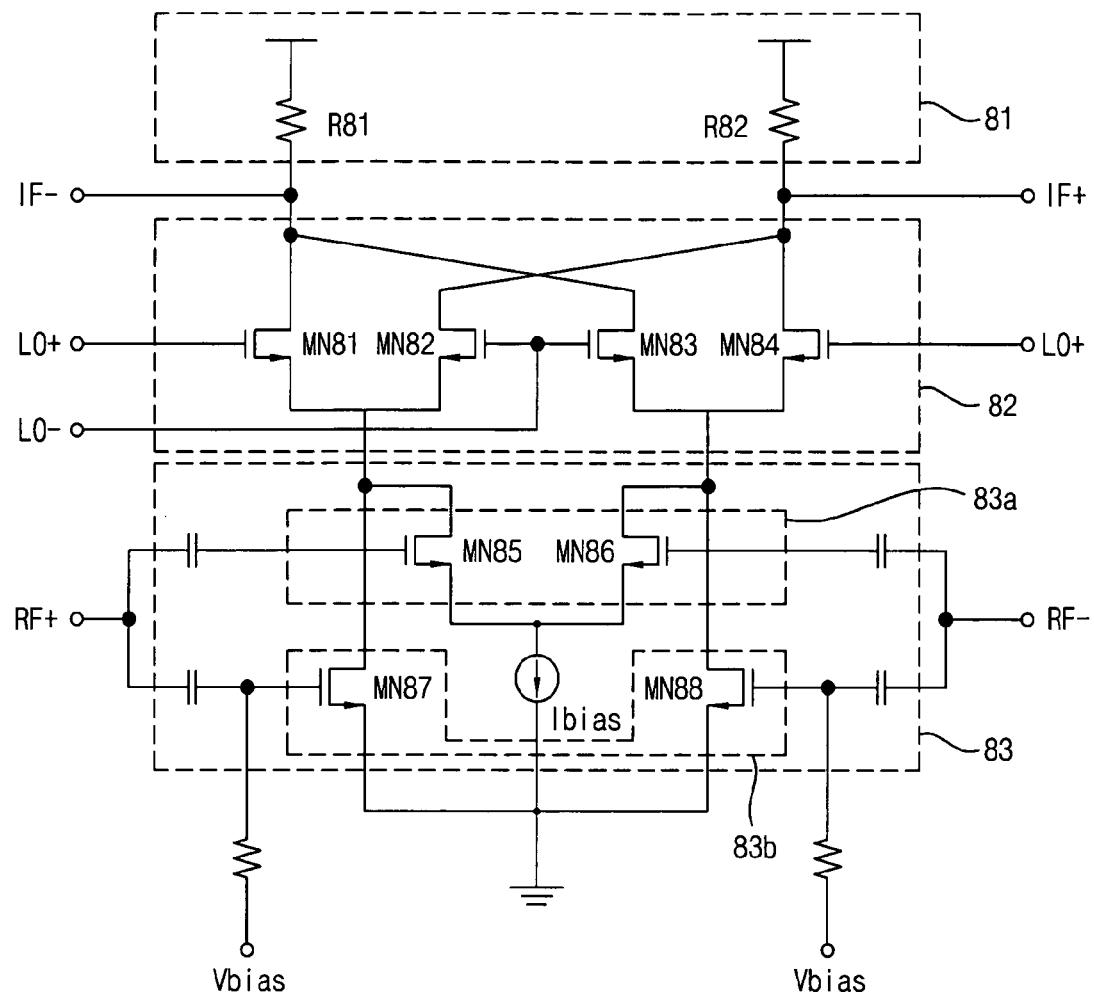
FIG. 8 is a circuit diagram of a double balance mixer circuit having the cascode auxiliary differential amplifier unit according to an embodiment of the present invention.

FIG. 8 is a circuit diagram of a double balance mixer circuit having the cascode auxiliary differential amplifier unit according to an embodiment of the present invention.

The double balance mixer circuit includes a load stage 81, a mixer stage 82 and an amplifier stage 83.

The load stage 81 includes load resistors R81, R82. Each of the load resistors R81, R82 is connected to the mixer stage 82.

The mixer stage 82 includes a first mixer unit in which first and second transistors MN81, MN82 form a differential pair, and a second mixer unit in which third and fourth transistors MN83, MN84 form a differential pair. The first to fourth transistors MN81, MN82, MN83 and MN84 have gates to which local oscillation signals LO+, LO−, respectively. Sources of the first and second transistors MN81, MN82 and sources of the third and fourth transistors MN83, MN84 are respectively coupled and then connected to the amplifier stage.

The amplifier stage 83 includes fifth and sixth transistors MN85, MN86 forming a differential pair. It also includes a main differential amplifier unit 83a consisting of a current source Ibias connected between sources of the fifth and sixth transistors MN85, MN86 and GND, and a auxiliary differential amplifier unit 83b in which seventh and eighth transistors MN87, MN88 form a differential pair.

To gates of the fifth and sixth transistors MN85, MN86 of the main differential amplifier unit 83a are applied input signals (signals having inversed phase, RF+, RF−). To gates of the seventh and eighth transistors MN87, MN88 of the auxiliary differential amplifier unit 83b are applied the bias current source Ibias of the auxiliary differential amplifier unit 83b.

At this time, the amplifier stage 83 mixes a RF signal amplified in the amplifier stage with the local oscillation signals LO+, LO−, and outputs intermediate frequency signals IF+, IF− to the output stage.

It is thus possible to construct the mixer circuit, which can improve IIP3 while not changing other advantages such as a gain through the above construction.

Figure 9:
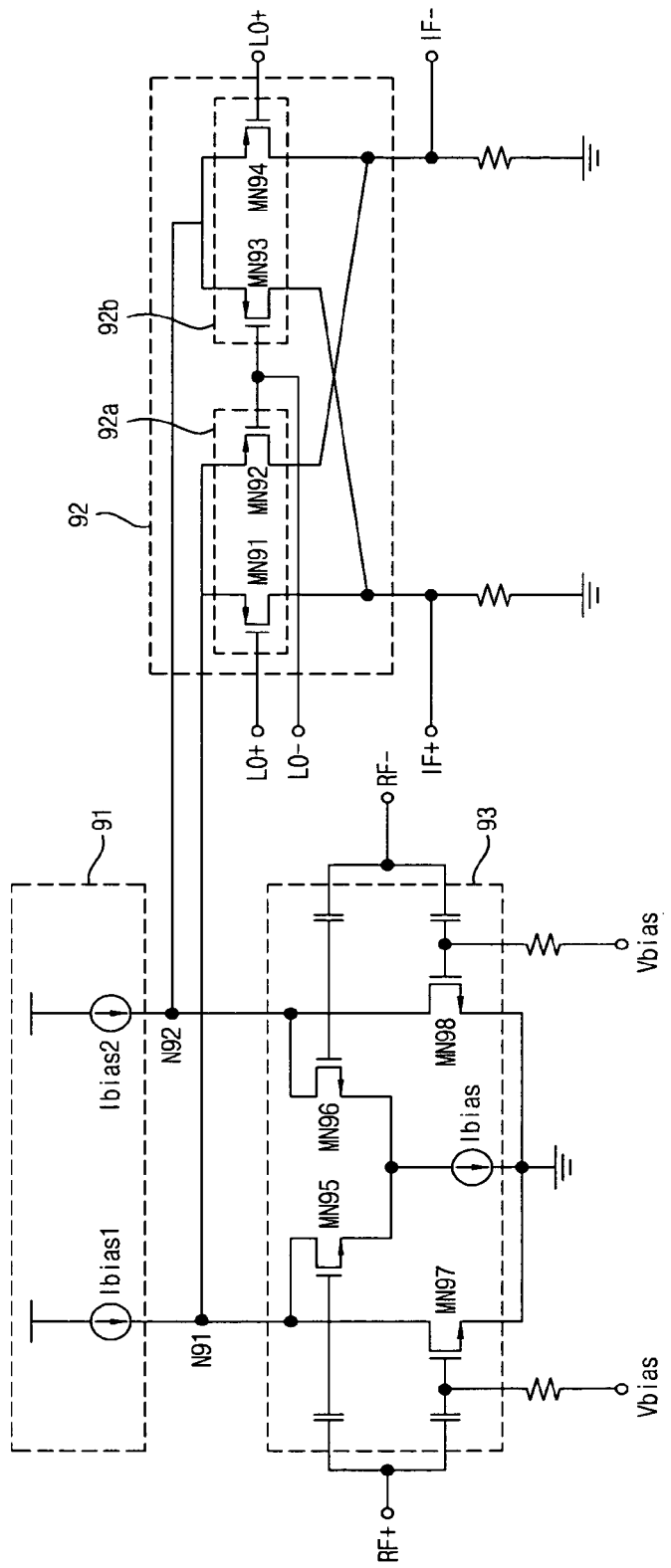
FIG. 9 is a circuit diagram of a folded cascode mixer circuit having the differential amplifier according to an embodiment of the present invention.

FIG. 9 is a circuit diagram of a folded cascode mixer circuit having the differential amplifier according to an embodiment of the present invention.

The folded cascode mixer circuit includes a load stage 91, a mixer stage 92 and an amplifier stage 93.

The load stage 91 has bias current sources Ibias1, Ibias2, and is connected to nodes N91, N92.

To the nodes N91, N92 are connected the mixer stage 92 and the amplifier stage 93.

The mixer stage 92 includes a first mixer unit 92a in which first and second transistors MP91, MP92 form a differential pair, and a second mixer unit 92b in which third and fourth transistors MP93, MP94 form a differential pair.

To gates of the first to fourth transistors MP91, MP92, MP93 and MP94 are input local oscillation signals LO+, LO−. Drains of the first and third transistors MP91, MP93 and drains of the second and fourth transistors MP92, MP94 are respectively coupled, and are then connected to GND. Sources of the first and second transistors MP91, MP92 and sources of the third and fourth transistors MP93, MP94 are respectively coupled, and then connected to nodes N91, N92.

At this time, the first to fourth transistors MP91, MP92, MP93 and MP94 are PMOS transistors.

The structure of the amplifier stage 93 is the same as the amplifier stage 83 of the double balance mixer shown in FIG. 8. Thus, description thereof will be omitted for simplicity.

In the same manner as FIG. 8, a RF signal amplified in the amplifier stage is mixed with the local oscillation signals LO+, LO−, and intermediate frequency signals IF+, IF− are then output.

It is thus possible to construct the folded cascode mixer circuit, which can improve IIP3 while not affecting other advantages such as a gain through the above construction.

Figure 10:
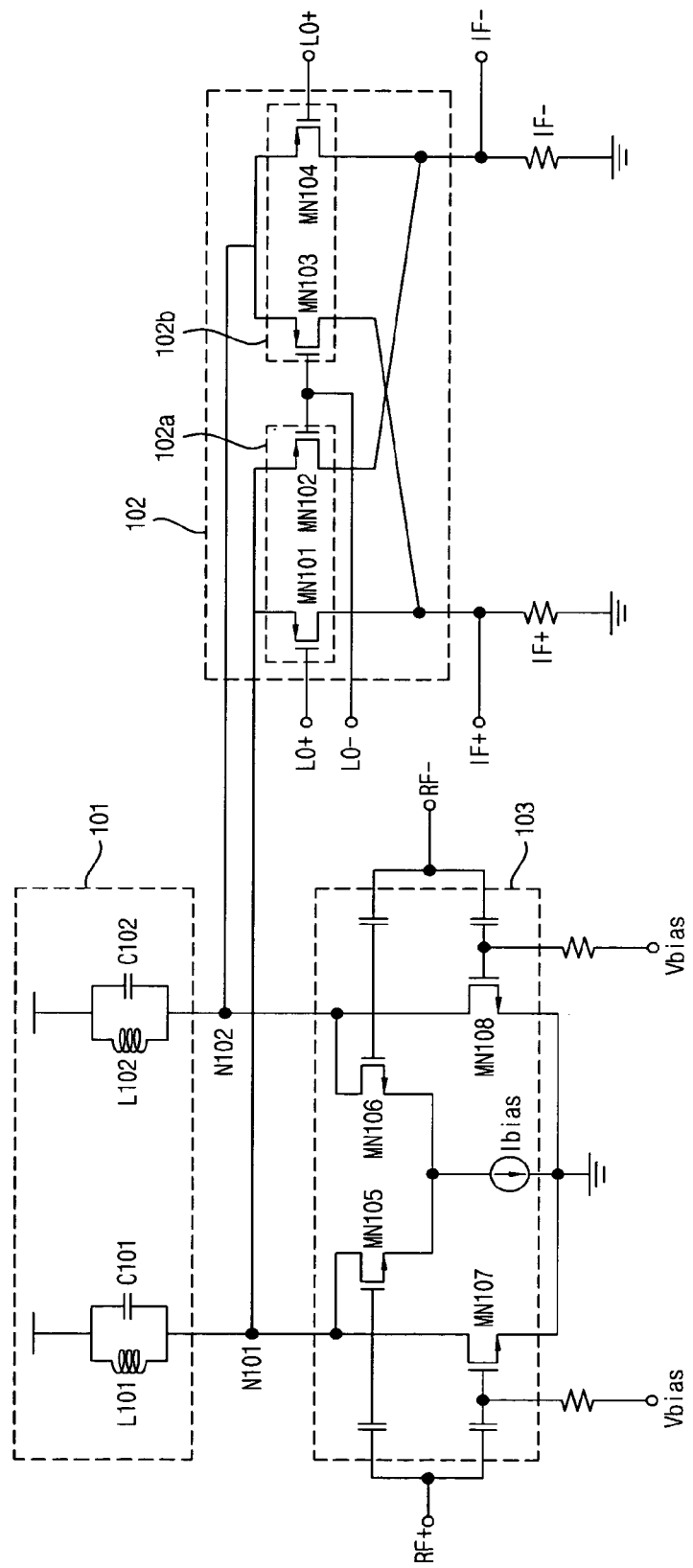
FIG. 10 is a circuit diagram of a LC-folded cascode mixer circuit having the differential amplifier according to an embodiment of the present invention.

FIG. 10 is a circuit diagram of a LC-folded cascode mixer circuit having the differential amplifier according to an embodiment of the present invention.

The LC-folded cascode mixer circuit includes a load stage 101, a mixer stage 102 and an amplifier stage 103. The load stage 101 includes a first load stage 101a in which a passive element inductor L101 and a capacitor C101 are connected in a parallel manner, and a second load stage 101b in which a passive element inductor L102 and a capacitor C102 are connected in a parallel manner. The mixer stage 102 and the amplifier stage 103 have the same construction as that of the mixer stage 92 and the amplifier stage 93 shown in FIG. 9. Description thereof will be thus omitted so as to avoid redundancy.

Figure 11:
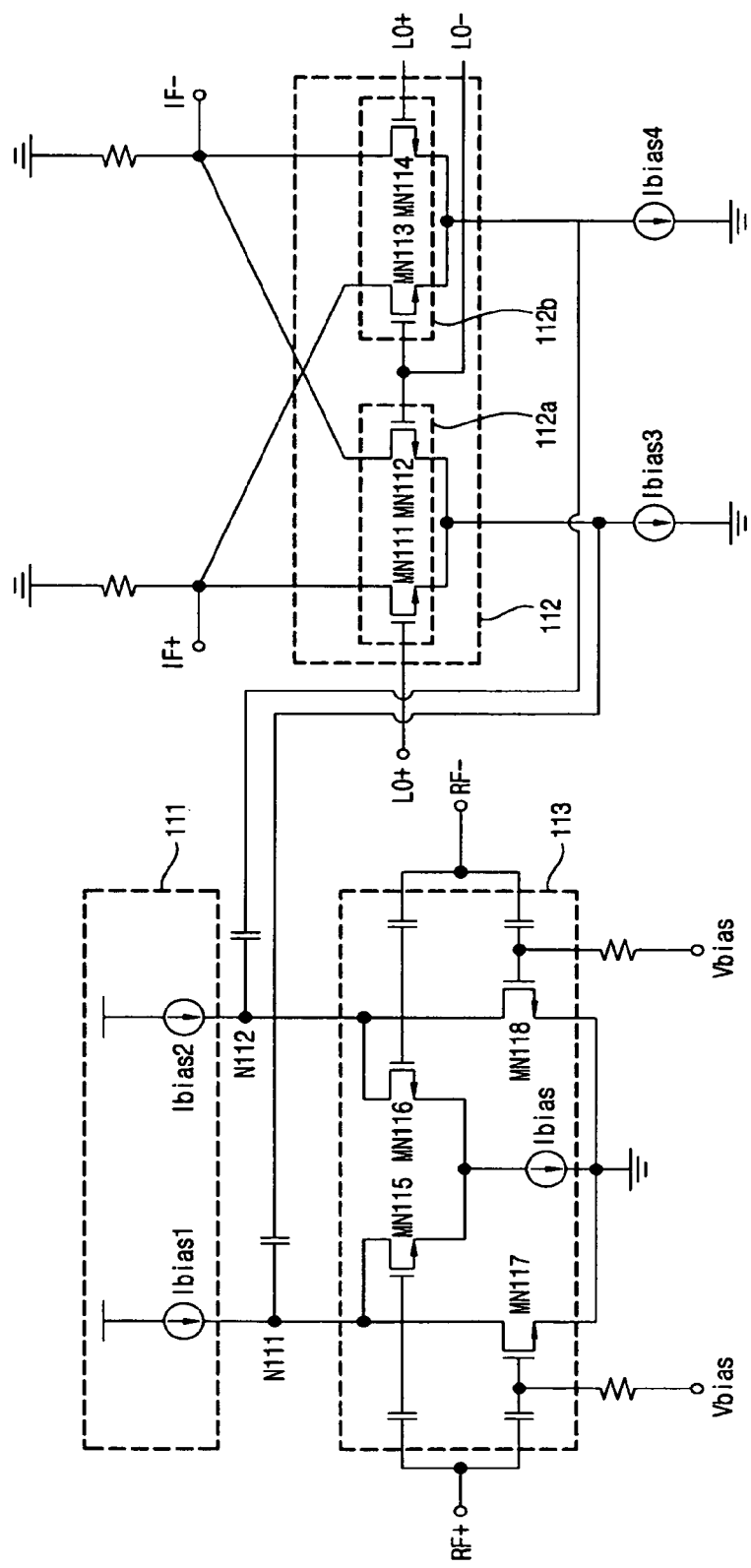
FIG. 11 is a circuit diagram of a folded cascode mixer circuit when the mixer stage is composed of a NMOS transistor in the folded cascode mixer circuit shown in FIG. 9.
Figure 12:
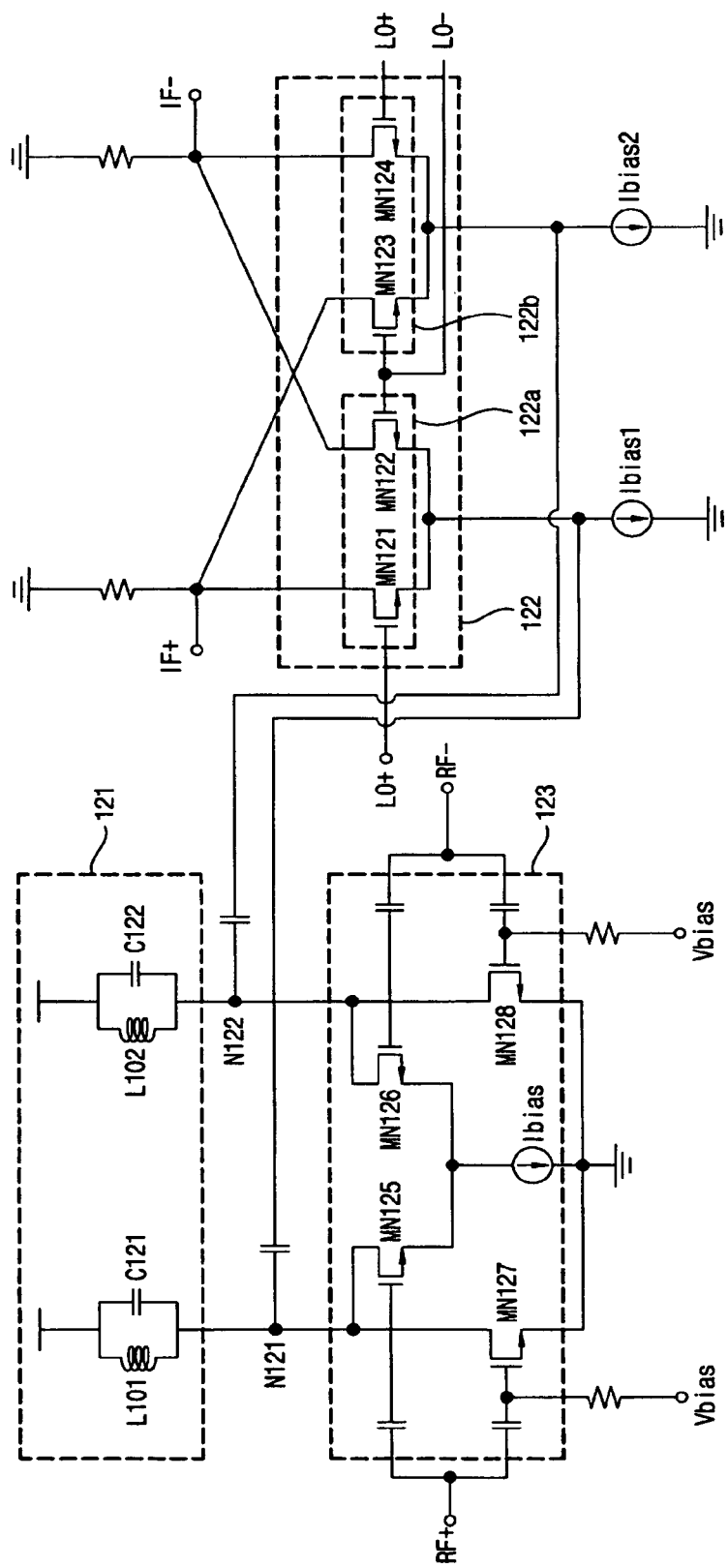
FIG. 12 is a circuit diagram when the mixer stage is composed of a NMOS transistor in the LC-folded cascode mixer circuit shown in FIG. 10.

FIG. 11 is a circuit diagram of a folded cascode mixer circuit when the mixer stage is composed of a NMOS transistor in the folded cascode mixer circuit shown in FIG. 9. FIG. 12 is a circuit diagram when the mixer stage is composed of a NMOS transistor in the LC-folded cascode mixer circuit shown in FIG. 10.

In the folded cascode mixer circuit shown in FIG. 11, first and second mixer units 112a, 112b are composed of NMOS transistors MN111, MN112, MN113 and MN114. Accordingly, the first and second mixer units 112a, 112b are connected to constant current sources Ibias3, Ibias4 for bias, respectively. The folded cascode mixer circuit shown in FIG. 11 has the same construction as the folded cascode mixer circuit shown in FIG. 9, and it also has the same acting effect as that of the folded cascode mixer circuit shown in FIG. 9.

The LC-folded cascode mixer circuit shown in FIG. 12 includes first and second mixer units 122a, 122b, and NMOS transistors MN121, MN122, MN123 and MN124. To the first and second mixer units 122a, 122b are connected constant current sources Ibias3, Ibias4 for bias, respectively. Further, the LC-folded cascode mixer circuit shown in FIG. 12 has the same construction as the LC-folded cascode mixer circuit shown in FIG. 10, and it also has the same acting effect as that of the LC-folded cascode mixer circuit shown in FIG. 10.

As described above, according to a differential amplifier circuit in accordance with the present invention, CMRR or IIP2 being the advantages of a differential circuit can be made high, and IIP3 can be improved.

Furthermore, the differential amplifier circuit in accordance with the present invention can be also applied to a mixer circuit having a differential amplifier. It is thus possible to implement a mixer circuit having improved linearity while making use of the advantages of the differential amplifier circuit.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A differential amplifier circuit, comprising:

first and second load stages each having a predetermined resistance value;

a main differential amplifier unit having a first differential stage that forms a differential pair in such a way as to amplify a difference between a first input voltage and a second input voltage, and a constant current source, which has a predetermined current driving capability and is connected serially between a power source voltage terminal and a ground terminal; and an auxiliary differential amplifier unit having a second differential stage that forms a differential pair in such a way as to amplify a difference between the first input voltage and the second input voltage, wherein the first input voltage is connected between the first load stage and the ground, and the second input voltage is connected between the second load stage and the ground, wherein the first differential stage has first and second transistors forming the differential pair, and the second differential stage has cascoded-connected third and fourth transistors and cascoded-connected fifth and sixth transistors forming the differential pair, wherein gates of the third and the fifth transistors are connected to ground and a bias voltage is applied to gates of the fourth and sixth transistors.

2. A differential amplifier circuit, comprising:

first and second load stages each having a predetermined resistance value;

a main differential amplifier unit having a first differential stage that forms a differential pair in such a way as to amplify a difference between a first input voltage and a second input voltage, and a constant current source, which has a predetermined current driving capability and is connected serially between a power source voltage terminal and a ground terminal; and an auxiliary differential amplifier unit having a second differential stage that forms a differential pair in such a way as to amplify a difference between the first input voltage and the second input voltage, wherein the first input voltage is connected between the first load stage and the ground, and the second input voltage is connected between the second load stage and the ground, wherein the first differential stage has cascoded first and second transistors and cascoded third and fourth transistors forming the differential pair, and the second differential stage has cascoded fifth and sixth transistors and cascoded seventh and eighth transistors forming the differential pair, wherein gates of the fifth and the seventh transistors are connected to ground and a bias voltage is applied to gates of the sixth and eighth transistors.

* * * * *